(12) United States Patent
Catanzaro et al.

(10) Patent No.: US 6,184,715 B1
(45) Date of Patent: Feb. 6, 2001

(54) BUS-HOLD INPUT CIRCUIT ADAPTED FOR RECEIVING INPUT SIGNALS WITH VOLTAGE LEVELS HIGHER THAN THE VOLTAGE SUPPLY THEREOF

(75) Inventors: Giorgio Catanzaro, Messina; Fabrizio Romano, Palermo, both of (IT)

(73) Assignee: STMicroelectronics S.r.l., Agrate Brianza (IT)

( * ) Notice: Under 35 U.S.C. 154(b), the term of this patent shall be extended for 0 days.

(21) Appl. No.: 09/191,624

(22) Filed: Nov. 13, 1998

(30) Foreign Application Priority Data

Nov. 14, 1997 (IT) ................................. MI97A2529

(51) Int. Cl.[7] .......................... H03K 19/0175; H03L 5/00
(52) U.S. Cl. ................. 326/81; 326/83; 326/24; 327/332
(58) Field of Search .................. 326/86, 80, 81, 326/83, 30, 23, 24; 327/57, 332, 333

(56) References Cited

U.S. PATENT DOCUMENTS

| | | | |
|---|---|---|---|
| 4,700,086 | * 10/1987 | Ling et al. ........................... 326/25 |
| 4,800,303 | * 1/1989 | Graham et al. ..................... 326/72 |
| 5,027,008 | * 6/1991 | Runaldue ............................ 326/30 |
| 5,486,779 | * 1/1996 | Eitrheim ............................. 327/51 |
| 5,646,557 | * 7/1997 | Runyon et al. ..................... 326/97 |
| 5,699,304 | * 12/1997 | Jung et al. ..................... 365/189.11 |
| 5,789,937 | * 8/1998 | Cao et al. ........................... 326/30 |
| 5,914,844 | * 6/1999 | Lutley et al. ..................... 361/111 |
| 5,933,021 | * 8/1999 | Mohd ................................. 326/30 |
| 6,049,242 | * 4/2000 | Lutley et al. ..................... 327/333 |

* cited by examiner

Primary Examiner—Michael Tokar
Assistant Examiner—Daniel D. Chang
(74) Attorney, Agent, or Firm—Theodore A. Galanthay; David V. Carlson; Seed IP Law Group PLLC

(57) ABSTRACT

An input circuit for an integrated circuit for interfacing an external signal line external to the integrated circuit includes first circuit means having an input that may be coupled to the signal line to provide a regenerated signal at their output, and second circuit means having an input coupled to receive the regenerated signal and driving the external signal line. The external signal line can thus be maintained at a predetermined logic level, even in the absence of any driving on the external signal line. Third circuit means are provided that are capable of providing to the second circuit means a supply voltage equal to the greater of a supply voltage of the integrated circuit to which the input circuit belongs, and the voltage existing on the external signal line.

21 Claims, 3 Drawing Sheets

BUS-HOLD INPUT CIRCUIT ADAPTED FOR RECEIVING INPUT SIGNALS WITH VOLTAGE LEVELS HIGHER THAN THE VOLTAGE SUPPLY THEREOF

TECHNICAL FIELD

The present invention relates to an input circuit. Input circuits are normally provided in integrated circuits for interfacing with external signals. In particular, the invention refers to an input circuit with "bus-hold" features, capable of receiving input signals with voltage levels higher than the voltage supply thereof.

BACKGROUND OF THE INVENTION

In the field of integrated circuits, input circuits are known with "bus-hold" or "bus-keeper" features, that is, that are capable of maintaining a prescribed logic state on the bus of external lines supplied thereto even when the driver circuits driving the bus are put in a high impedance (tri-state) mode. In this way, it is possible to maintain on the lines of the bus a well defined logic state even when no circuits drive the bus, preventing leakage currents due to a not well defined logic state, or avoiding the necessity of pull-up or pull-down resistors.

A typical structure of a bus-hold input circuit includes two inverters, for example of the CMOS type, coupled to form a latch circuit which keeps and regenerates an input signal applied to a signal line coupled to the input of the input circuit. A first inverter receives the input signal and provides a regenerated output signal, which is then supplied to the remaining blocks of the integrated circuit to which the input circuit belongs. The second inverter has an input coupled to the output of the first inverter and an output coupled to the input signal line which is to be kept at a prescribed logic level, even in the absence of an external driving signal. Typically, the second inverter has a high output impedance, so to be easily driven by the driver of the external signal line, when the driver is activated. In this way, the signal line can be driven by another, stronger drive circuit.

Depending on the particular application, it is necessary that the input circuit assure, for a given voltage on the input signal line, well defined values for the so-called "sustaining current", in a bus-hold mode of operation, and for an overdrive current to be furnished to the signal line by an external driver driving the signal line. These voltage and current parameters have values that are specified, depending on the particular application, and can vary with the particular application.

Bus-hold input circuits are also known whereby the second inverter is clocked, or whereby the second inverter can be put in a high-impedance condition. In some applications it could be useful to disable the input circuit bus-hold function for a prescribed logic level on the input signal line, or even to disable the bus-hold function. This is achieved by providing, in series to P and N channel MOSFETs (pull-up and pull-down) forming the second inverter, transistors of the same type (a P-channel MOSFET in series with the pull-up, and an N-channel MOSFET in series with the pull-down) controlled by a drive signal for turning the MOSFETs ON and OFF to enable or disable the bus-hold finction, respectively, for the high or low logic states.

Additionally, bus-hold input circuits are known where the second inverter is replaced by a NAND or NOR logic gate with two inputs, one connected to the output of the first inverter and the other behaving as a control input for a control signal that, depending on its state, allows the function of the input circuit to be changed from a bus-hold function to a simple pull-up or pull-down function for the signal line coupled to the input. This is useful in applications involving microprocessors, where it is necessary to put the lines of the external bus to a prescribed logic level during the execution of particular scanning tests.

Another known bus-hold input circuit structure provides two inverters coupled in series, with the input of the first inverter coupled to the input signal line, and the output of the second inverter forming the regenerated signal which is supplied to the remaining blocks of the integrated circuit. The output of the second inverter is also coupled to the input of the first inverter and thus to the input signal line, again forming a latch circuit and maintaining the signal on the input signal line.

These input circuits are not capable of accepting input signals with voltages higher than the supply voltage of the input circuit. This feature, in the case of input circuits with a 3.3 V supply, means that the input circuits are not capable of accepting voltages of 5 V.

The reason why the proposed bus-hold input circuits are not capable of tolerating input voltages higher than their own power supply voltage is that in all the bus-hold circuits the input signal line is always connected to the drain electrode of a P-channel MOSFET of the second inverter or, more generally, of the logic gate that, together with the first inverter, forms the latch maintaining the signal on the input line. When the voltage on the input signal line exceeds the supply voltage of the input circuit by at least one turn-on threshold of a PN junction, a parasitic diode associated with the P+ drain region of the P-channel MOSFET and the N type bulk of such a MOSFET (connected to the $V_{DD}$ voltage of the input circuit) turns ON, setting up a direct path between $V_{DD}$ and the input.

SUMMARY OF THE INVENTION

An input circuit for an integrated circuit for interfacing an external signal line external to the integrated circuit includes a first circuit for receiving an input signal on the signal line and providing at an output a regenerated signal, A second circuit receiving the regenerated signal at an input and drives the external signal line to maintain a predetermined logic level on the external signal line, even in the absence of any external signal driving the external signal line. A third circuit is capable of providing to the second circuit a supply voltage equal to the greater of a supply voltage of the integrated circuit to which the input circuit belongs, and the voltage existing on the external signal line. As a result, the integrated circuit can accept input signals having voltages that are greater than a supply voltage of the integrated circuit.

For example, in some types of circuits, a capability for accepting a 5 volt input signal by an integrated circuit having a lower power supply voltage is called "5V tolerance". This feature is particularly important considering that even if there is a trend towards integrated circuits working at 3.3 V, there is often the necessity of incorporating in a same electronic system integrated circuits using a 3.3 V power supply and integrated circuits using a 5 V power supply. A capability for the input circuits to accept input voltages of 5 V allows signals to be coupled between electronic circuit boards that were designed at different times. The necessity of having input circuits capable of tolerating input signals with voltages higher than their own power supply voltages is not only dictated by the current standards (5V and 3.3V), but the same need will be felt in the future, for different voltage pairs, e.g, 3.3V and 2.5V.

DETAILED DESCRIPTION OF THE INVENTION

Figure 1:
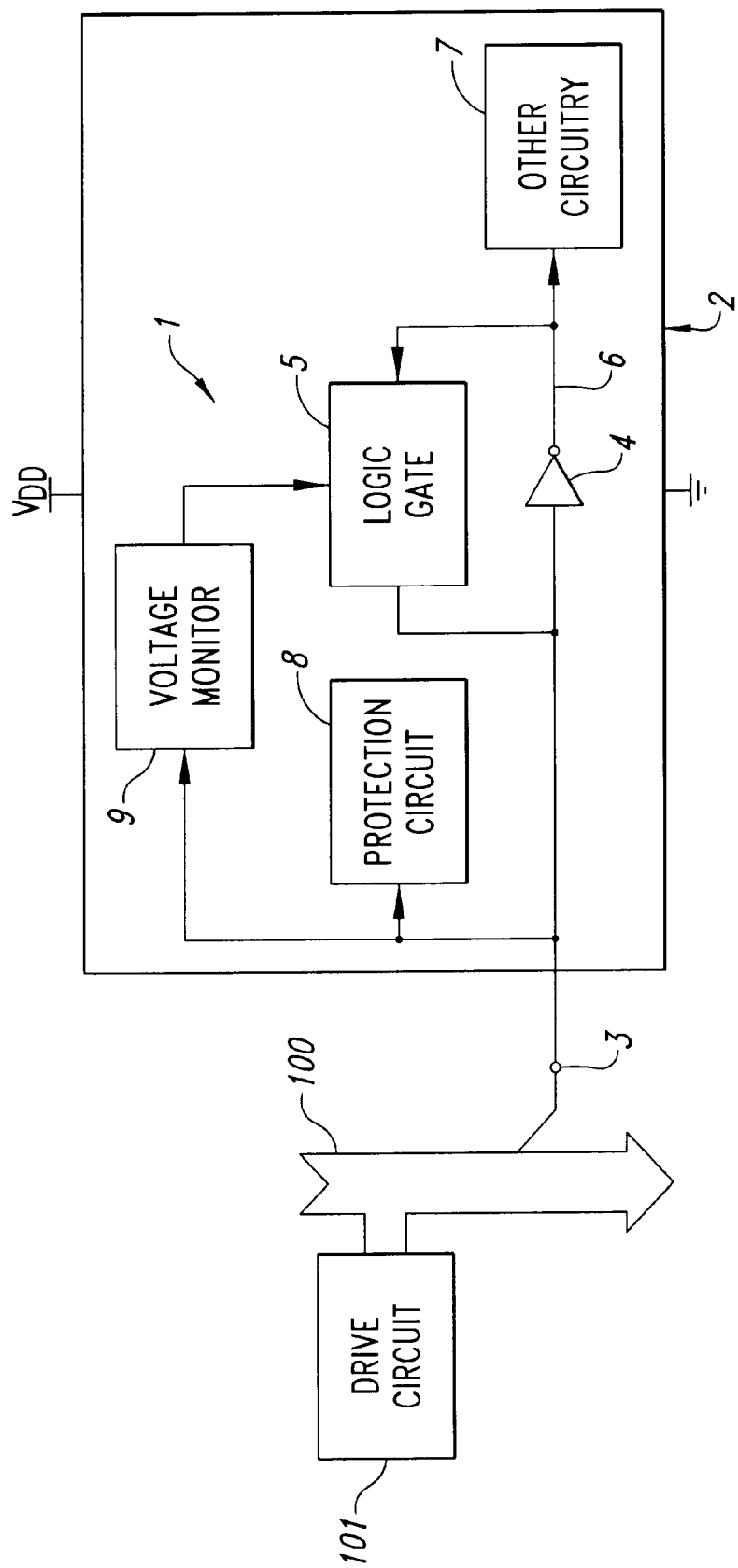
FIG. 1 is a simplified block diagram of an input circuit, in accordance with an embodiment of the present invention.

FIG. 1 is a simplified block diagram of an input circuit 1 for a generic integrated circuit 2, in accordance with an embodiment of the present invention. The integrated circuit 2 normally includes several input circuits 1, for interfacing with an external bus of signal lines 100 coupled to the integrated circuit 2, of which bus only one signal line 3 is shown in FIG. 1. Signal line 3 is an input line for the integrated circuit 2.

The input circuit 1 is of the bus-hold or bus-keeper type, and includes, as do conventional bus-hold input circuits, an inverter 4, which may be in CMOS technology. The inverter 4 has an input coupled to the signal line 3. A feedback logic gate 5 has an input coupled to an output line 6 of the inverter 4 and an output coupled to the signal line 3. The output line 6 of inverter 4 is supplied to the remaining circuitry 7 of the integrated circuit 2. In a per-se known way, the input circuit 1 comprises an overvoltage protection network 8, for the protection of the integrated circuit 2 against overvoltages on the signal line 3, for example caused by electro-static discharges which, as known, are highly dangerous for MOS-technology circuits. The inverter 4 regenerates the signal on the signal line 3 and drives the output line 6 with a signal corresponding to that existing on line 3, but regenerated.

The feedback logic gate 5 works as a bus-holding latch, since it maintains on the signal line 3 the logic state existing on the output line 6 of the inverter 4 even when the signal line 3 (more generally, the bus of signal lines 100 external to the integrated circuit 2) is not driven by any external driving circuit (for example, referring to FIG. 1, when a driving circuit 101 driving bus 100 is placed in high impedance or tri-state mode of operation). The logic gate 5 can be formed by a simple CMOS inverter similar to inverter 4, or a clocked CMOS inverter or a disactivatable CMOS inverter, or a NAND or NOR gate. In any case, the output of logic gate 5, i.e., the signal line 3, is always connected the drain electrode of a P-channel MOSFET working as a pull-up device for keeping the signal line 3 at logic "1" when the signal line 3 is not being actively driven by the circuit 101. This is why conventional bus-hold input circuits cannot tolerate input signals with voltage levels higher than the supply voltage of the input circuit, because when the voltage on signal line 3 exceeds the supply voltage of the input circuit by at least one turn-on threshold of a PN junction, the parasitic diode between the P+ drain region of the P-channel MOSFET (connected to signal line 3) and the N type bulk of such a MOSFET (connected to the supply voltage of the input circuit) turns ON, causing a direct path between $V_{DD}$ and the input.

According to the present invention, the input circuit 1 also comprises a further circuit 9 monitoring the voltage existing on the signal line 3 and coupled to the feedback logic gate 5, preventing the above-referred parasitic diode from turning ON. In particular, the circuit 9 supplies the logic gate 5 with a supply voltage which is always the greater of the supply voltage of the integrated circuit 2 and the voltage existing on the input line 3. In this way, since the bulk electrode of the P-channel MOSFET of the logic gate 5 is normally connected to the source electrode of such a MOSFET, the circuit 9 allows the bulk electrode of the P-channel MOSFET of the logic gate 5 to be biased to a voltage that is always the greater of the supply voltage $V_{DD}$ of the input circuit 1 and the voltage present on the signal line 3, preventing the parasitic diode from turning ON, irrespective of the voltage present on the signal line 3. Because of the circuit 9, it is possible to realize an input circuit 1 that, in addition to the bus-hold function, tolerates input voltages higher than the supply voltage of the integrated circuit 2 to which it belongs.

Figure 2:
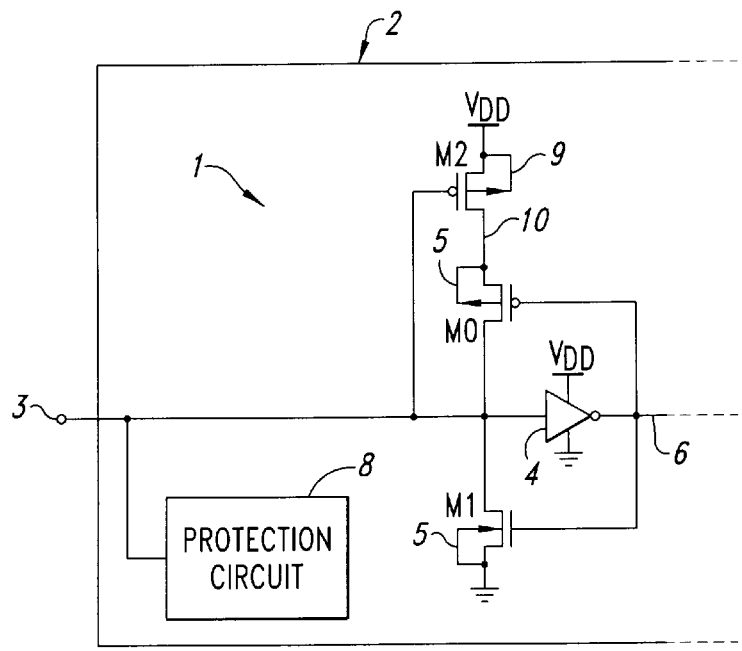
FIG. 2 is a simplified schematic diagram illustrating an embodiment of the circuit of FIG. 1.
Figure 3:
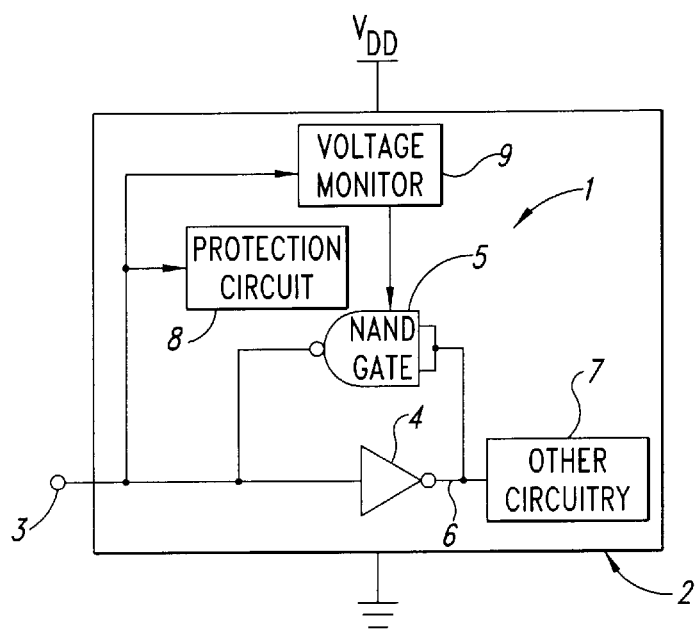
FIG. 3 is a simplified schematic diagram illustrating an embodiment of the circuit of FIG. 1 using a NAND gate.
Figure 4:
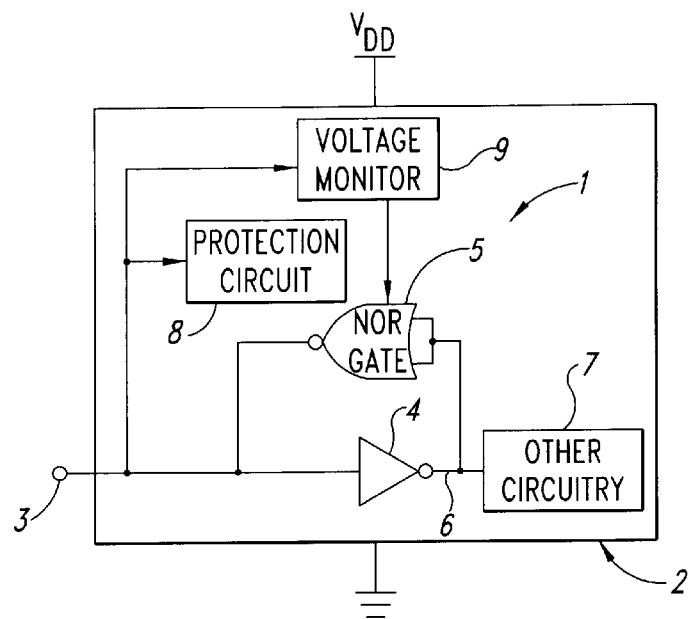
FIG. 4 is a simplified schematic diagram illustrating an embodiment of the circuit of FIG. 1 using a NOR gate.
Figure 5:
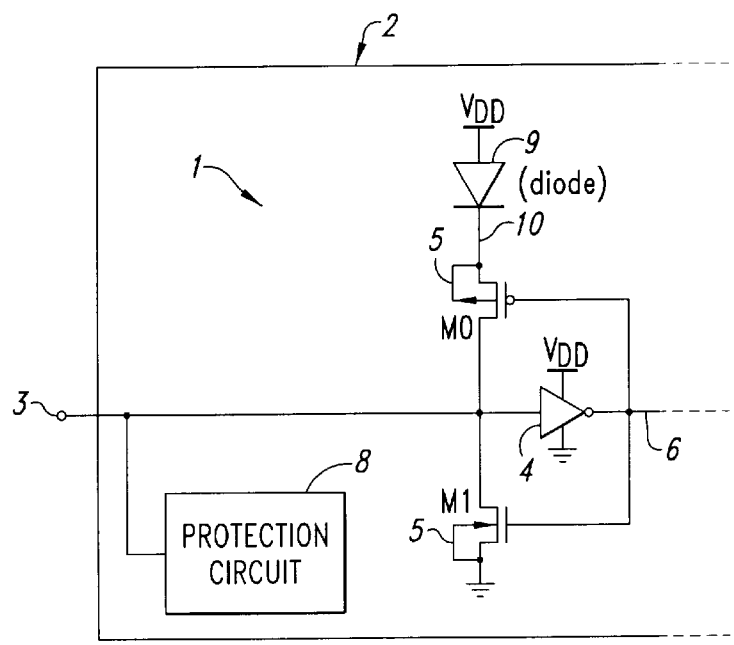
FIG. 5 is a simplified schematic diagram illustrating an embodiment of the circuit of FIG. 2 using a diode.

One implementation of the circuit shown in FIG. 1 is depicted in FIG. 2. The feedback logic gate 5 is formed by a pair of MOSFETs M0, M1, the first one P-channel and the second one N-channel, connected in series, with the source electrode of M1 connected to ground and the gate electrodes of M0 and M1 driven by the output line of the inverter 4. M0 and M1 form a CMOS inverter 5, but the source electrode of M0 is not connected directly to the supply voltage $V_{DD}$, but through a further P-channel MOSFET M2 which, in this implementation, forms the circuit 9 of FIG. 1. The bulk or body electrode of M1 is connected to ground, as in conventional CMOS integrated circuits. The bulk electrode of M0 is connected to the source electrode of M0 and thus, through a line 10, to the drain electrode of M2. Line 10 forms a floating bulk electrode, as it will be better explained in the description of the operation of the circuit of FIG. 2. As long as the voltage on the signal line 3 remains below the supply voltage $V_{DD}$ of at least the tun-on threshold voltage of the transistor M2, the transistor M2 is turned ON and the floating bulk line 10 is kept at $V_{DD}$.

For higher voltages on signal line 3, the inverter 4 turns ON the MOSFET M0 and the latter couples the floating bulk line 10 to the signal line 3 through the transistor M0. The voltage on the floating bulk line 10 tracks the voltage on the input line 3, even when the voltage on the line 3 exceeds the supply voltage $V_{DD}$. This assures that the floating bulk line 10 is always biased to the greater of the supply voltage $V_{DD}$ and the voltage existing on the signal line 3, except in the range of voltages in which the transistor M2 is in the linear region. In this range of voltages, however, the MOSFET M0 is already turned ON and the floating bulk line 10 is below $V_{DD}$ by a voltage less than the threshold voltage of the parasitic diode source/bulk of the MOSFET M2. Consequently, the parasitic diode associated to the drain electrode and the bulk electrode of the transistor M0 is always turned OFF.

The operation as a bus-hold is guaranteed by the feedback of the logic gate 5, regenerating the signal on line 3. When the signal on line 3, before the external circuit 101 driving line 3 is disabled, is at the low logic level, the output line 6 of inverter 4 is at the high logic level ($V_{DD}$) and this keeps the transistor M1 turned ON, re-enforcing the low logic level on line 3 and keeping such a level even in the absence of an external signal driving line 3 from any external circuit 101 (FIG. 1). When the signal on line 3 is at logic "1", after the external drive circuit driving line 3 has been disabled, line 3 is kept at logic "1" by the MOSFET M0, that is maintained by the presence of a logic "0" on line 6. The voltage at which the source electrode of the MOSFET M0 is biased, i.e., the voltage at which line 3 is maintained, is the voltage to which the source electrode of M0 was biased before the external circuit 101 driving line 3 was disabled. Since line 3 (and generally all the signal lines of the external bus 100) is floating, there is no current flow and the voltage remains constant.

In the case where a load that absorbs current is coupled to the line 3, the voltage on line 3 is reduced. When the voltage falls below VDD by a turn-on threshold of a P-channel MOSFET, the transistor M2 turns ON, thus pulling up the voltage of line 10. By properly dimensioning the MOSFETs M0, M1 and M2, it is possible to assure that the transfer characteristic in the linear region of the transistor M2 guarantees the necessary sustaining and overdriving currents required by the ratings for the particular application.

Even though the feedback logic gate 5 is shown as being formed by a simple CMOS inverter, the feedback logic gate 5 can obviously be formed by a more complex logic gate, e.g., a NAND or NOR gate, or it can be formed as a clocked inverter or other gate providing an inverting function. For the implementation of the present invention it is sufficient that the bulk electrode of the P-channel MOSFETs of the structures is not connected directly to VDD, the supply voltage of the integrated circuit 2, but it is connected to a floating bulk line.

The circuit 9 of FIG. 1, which in the implementation of FIG. 2 is formed by the MOSFET M2, could as well be simply formed by a diode with an anode connected to VDD and a cathode connected to line 10. Such a diode can be formed by a PN junction, if the manufacturing process of the integrated circuit 2 so allows (e.g., a BiCMOS process), or by a diode-connected MOSFET (e.g., modifying the circuit of FIG. 2 so that the gate of the transistor M2 is short-circuited to the drain thereof, i.e., to line 10).

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An input circuit for an integrated circuit for interfacing an external signal line to said integrated circuit, comprising:
    first circuit means for coupling to said external signal line and for generating an output to provide a regenerated signal;
    second circuit means for receiving said regenerated signal and for driving said external signal line to maintain on said external signal line an external voltage at a predetermined logic level in absence of any driving of said external signal line, the second circuit means having a first P-channel MOSFET with a bulk terminal coupled to a second supply voltage; and
    third circuit means for coupling to said second circuit means and for providing to said second circuit means said second supply voltage equal to a greater of a first supply voltage of said integrated circuit to which said input circuit belongs and said external voltage existing on said external signal line.

2. The input circuit according to claim 1, wherein said second circuit means comprises a logic gate.

3. The input circuit according to claim 2, wherein said logic gate is a CMOS logic gate.

4. The input circuit according to claim 3, wherein said logic gate comprises the first P-channel MOSFET with a first electrode connected to said external signal line, a second electrode coupled to said second supply voltage, and a control electrode coupled to said regenerated signal.

5. The input circuit according to claim 4, wherein said logic gate is a CMOS inverter.

6. The input circuit according to claim 5, wherein said CMOS inverter is selectively activatable/disactivatable by means of activation/disactivation inputs.

7. The input circuit according to claim 5, wherein said logic gate is a NAND gate having an input connected to said regenerated signal.

8. The input circuit according to claim 5, wherein said logic gate is a NOR logic gate having an input connected to said regenerated signal.

9. The input circuit according to claim 1, wherein said third circuit means are suitable for monitoring said voltage existing on said external signal line.

10. The input circuit according to claim 9, wherein said third circuit means comprises a second P-channel MOSFET with a first electrode connected to said supply voltage of said integrated circuit to which said input circuit belongs, a second electrode operatively connected to said second electrode of said first P-channel MOSFET, a control electrode connected to said external signal line and a bulk electrode connected to said second electrode of said second P-channel MOSFET.

11. The input circuit according to claim 1, wherein said third circuit means comprises diode means interposed between said supply voltage of said integrated circuit and said supply voltage of said second circuit means.

12. A circuit interfacing an external signal line to an integrated circuit, comprising:
    a first circuit having a first input and a first output, the first circuit inverting a signal on the first input to provide an output signal on the first output;
    a second circuit having a second input coupled to the first output and a second output coupled to the first input, the second circuit inverting a signal on the second input to provide a second output signal on the second output, the first and second circuits collectively forming a latch; and
    a third circuit having a third input coupled to the first input, a fourth input coupled to a supply voltage of the second circuit and an output coupled to a supply node of the second circuit, the third circuit supplying the greater of a voltage on the first input and the supply voltage to the supply node, the third circuit comprising a MOSFET having a gate directly connected to the first input.

13. The circuit of claim 12, wherein the first circuit comprises a CMOS inverter.

14. The circuit of claim 13, wherein the MOSFET of the third circuit is a p-channel MOSFET further comprising a body terminal coupled to a drain of the MOSFET and a source coupled to the power supply, the drain being coupled to the supply node.

15. The circuit of claim 13, wherein the second circuit comprises:
    a p-channel MOSFET having a gate coupled to the first output, a drain coupled to the first input and a source coupled to the supply node; and
    a n-channel MOSFET having a gate coupled to the first input, a source coupled to ground and a drain coupled to the first input.

16. The circuit of claim 13, wherein:
    the first circuit comprises a CMOS inverter;
    the second circuit includes:
        a first p-channel MOSFET having a gate coupled to the first output, a drain coupled to the first input and a source coupled to the supply node; and a n-channel MOSFET having a gate coupled to the first input, a source coupled to ground and a drain coupled to the first input; and the MOSFET of the third circuit is a second p-channel MOSFET further comprising a body terminal coupled to a drain of the second MOSFET, and a source coupled to the power supply, the drain of the second MOSFET being coupled to the supply node.

17. A method of varying a voltage supplied to a power node of a logic element comprising:

coupling an input signal to an input of a switching circuit;

comparing a voltage of the input signal to a power supply voltage by directly connecting a gate of a first p-channel MOSFET to the input signal; and coupling the input signal to the power node when the input signal voltage is greater than the power supply voltage.

18. The method of claim 17, further comprising coupling the power supply voltage to the power node when the power supply voltage is greater than the input voltage.

19. The method of claim 17, wherein coupling the input signal to the power node comprises biasing a gate of a second p-channel MOSFET to turn the second p-channel MOSFET ON, where the second p-channel MOSFET forms part of a CMOS inverter.

20. The method of claim 18, wherein coupling the power supply voltage to the power node comprises biasing the gate of the first p-channel MOSFET to turn the first p-channel MOSFET ON, where the first p-channel MOSFET is coupled between a CMOS inverter power node and a power supply.

21. A circuit interfacing an external signal line to an integrated circuit, comprising:

a first circuit having a first input and a first output, the first circuit inverting a signal on the first input to provide an output signal on the first output;

a second circuit having a second input coupled to the first output and a second output coupled to the first input, the second circuit inverting a signal on the second input to provide a second output signal on the second output; and a transistor configured to supply the greater of a voltage on the first input and a supply voltage to a supply node of the second circuit, the transistor comprising:

a body;

a source coupled to the supply voltage;

a gate coupled to the first input; and a drain coupled to the supply node of the second circuit and to the body.

* * * * *